(12) United States Patent
Miyakawa et al.

(10) Patent No.: US 10,869,413 B2
(45) Date of Patent: Dec. 15, 2020

(54) HEAT-DISSIPATING COMPONENT AND METHOD FOR MANUFACTURING SAME

(71) Applicant: DENKA COMPANY LIMITED, Tokyo (JP)

(72) Inventors: Takeshi Miyakawa, Omuta (JP); Motonori Kino, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 26 days.

(21) Appl. No.: 15/322,494

(22) PCT Filed: Jul. 3, 2015

(86) PCT No.: PCT/JP2015/069317
§ 371 (c)(1),
(2) Date: Dec. 28, 2016

(87) PCT Pub. No.: WO2016/002943
PCT Pub. Date: Jan. 7, 2016

(65) Prior Publication Data
US 2017/0142859 A1    May 18, 2017

(30) Foreign Application Priority Data
Jul. 4, 2014 (JP) .................. 2014-138288

(51) Int. Cl.
*H01L 21/48* (2006.01)
*H01L 23/373* (2006.01)
(Continued)

(52) U.S. Cl.
CPC ............. *H05K 7/209* (2013.01); *B22D 19/00* (2013.01); *B22D 19/14* (2013.01); *B22D 21/007* (2013.01);
(Continued)

(58) Field of Classification Search
None
See application file for complete search history.

(56) References Cited

U.S. PATENT DOCUMENTS 3,808,015 A * 4/1974 Seufert ............. C04B 35/62236
501/95.1
4,152,149 A * 5/1979 Horikiri ............. C04B 35/62245
148/437
(Continued)

FOREIGN PATENT DOCUMENTS

EP     0213528 A2 *  3/1987  ............. C22C 49/06
EP     2599749 A1 *  6/2013  ............. C30B 11/12
(Continued)

OTHER PUBLICATIONS

Machine Translation of JP 2003204022 A, Jul. 2003 (Year: 2003).*
(Continued)

*Primary Examiner* — Jeffrey A Vonch
(74) *Attorney, Agent, or Firm* — Oliff PLC

(57) ABSTRACT

A heat-dissipating component, and a method for manufacturing the same, the component provided with a composited portion including a plate-shaped molded body containing silicon carbide, and hole-formation portions formed in a peripheral edge portion of the composited portion; through-holes being formed in the hole formation sections; the hole-formation portions containing inorganic fibers; the molded body and the inorganic fibers being impregnated with an aluminum-containing metal; and the hole-formation portions forming a part of the outer peripheral surface of the heat-dissipating component.

4 Claims, 2 Drawing Sheets

(51) Int. Cl.

| | | |
|---|---|---|
| *H01L 23/40* | (2006.01) | |
| *C22C 47/08* | (2006.01) | |
| *C22C 49/06* | (2006.01) | |
| *C22C 49/14* | (2006.01) | |
| *C04B 35/565* | (2006.01) | |
| *H05K 7/20* | (2006.01) | |
| *B22D 19/14* | (2006.01) | |
| *B22D 19/00* | (2006.01) | |
| *C22C 47/06* | (2006.01) | |
| *B22D 21/00* | (2006.01) | |
| *C04B 41/51* | (2006.01) | |
| *C09K 5/14* | (2006.01) | |
| *C22C 21/02* | (2006.01) | |
| *C22C 21/08* | (2006.01) | |
| *C22C 47/12* | (2006.01) | |

(52) U.S. Cl.
CPC ........ *C04B 35/565* (2013.01); *C04B 41/5155* (2013.01); *C09K 5/14* (2013.01); *C22C 21/02* (2013.01); *C22C 21/08* (2013.01); *C22C 47/06* (2013.01); *C22C 47/08* (2013.01); *C22C 49/06* (2013.01); *C22C 49/14* (2013.01); *H01L 21/4871* (2013.01); *H01L 23/3733* (2013.01); *C22C 47/12* (2013.01); *H01L 23/4006* (2013.01); *Y10T 428/12361* (2015.01)

(56) References Cited

U.S. PATENT DOCUMENTS

| | | | | |
|---|---|---|---|---|
| 4,232,091 A * | 11/1980 | Grimshaw | ............ | B22D 19/02 164/91 |
| 4,444,603 A * | 4/1984 | Yamatsuta | ............ | C22C 47/04 148/549 |
| 4,452,865 A * | 6/1984 | Yamatsuta | ............ | C22C 47/08 148/437 |
| 4,457,979 A * | 7/1984 | Donomoto | ............ | C22C 49/14 420/590 |
| 4,595,638 A * | 6/1986 | Dohnomoto | ............ | C22C 47/08 420/408 |
| 4,664,704 A * | 5/1987 | Dohnomoto | ............ | C22C 47/025 75/229 |
| 4,777,097 A * | 10/1988 | Kubo | ............ | C22C 49/06 420/533 |
| 4,818,633 A * | 4/1989 | Dinwoodie | ............ | C22C 49/14 428/614 |
| 5,320,791 A * | 6/1994 | Saitou | ............ | B82Y 30/00 264/177.11 |
| 5,573,718 A * | 11/1996 | Shih | ............ | C04B 35/62236 264/623 |
| 5,972,523 A * | 10/1999 | Qin | ............ | C22C 1/05 428/614 |
| 6,348,428 B1 * | 2/2002 | Misu | ............ | D01F 9/08 264/604 |
| 6,399,187 B1 * | 6/2002 | Terasaki | ............ | C04B 38/0003 257/E23.009 |
| 6,447,894 B1 * | 9/2002 | Hirotsuru | ............ | C04B 41/009 257/E23.112 |
| 2007/0248829 A1 * | 10/2007 | Iwamoto | ............ | H01L 23/142 428/446 |
| 2009/0092793 A1 * | 4/2009 | Hirotsuru | ............ | C22C 29/065 428/158 |
| 2009/0108437 A1 * | 4/2009 | Raymond | ............ | H01L 23/3735 257/713 |
| 2009/0280351 A1 | 11/2009 | Hirotsuru et al. | | |
| 2010/0143690 A1 * | 6/2010 | Narciso Romero | .. | C04B 41/009 428/293.1 |
| 2017/0107158 A1 * | 4/2017 | Goto | ............ | H01L 23/3733 |

FOREIGN PATENT DOCUMENTS

| | | | | | |
|---|---|---|---|---|---|
| JP | 62139841 | A * | 6/1987 | | |
| JP | 63086833 | A * | 4/1988 | | |
| JP | H05-507030 | A | 10/1993 | | |
| JP | H09-157773 | A | 6/1997 | | |
| JP | 11354698 | A * | 12/1999 | ............ | C22C 49/06 |
| JP | 2002241871 | A * | 8/2002 | | |
| JP | 2003-204022 | A | 7/2003 | | |
| JP | 2003193210 | A * | 7/2003 | | |
| JP | 2003309232 | A * | 10/2003 | | |
| JP | 3468358 | B2 | 11/2003 | | |
| JP | 2004154834 | A * | 6/2004 | | |
| JP | 2009013460 | A * | 1/2009 | | |
| JP | 2010024077 | A * | 2/2010 | | |
| WO | 91/17011 | A1 | 11/1991 | | |
| WO | 2007/080701 | A1 | 7/2007 | | |

OTHER PUBLICATIONS

EP 213528 A2, Mar. 1987 (Year: 1987).*
Machine Translation of JP 11354698 A, Dec. 1999 (Year: 1999).*
Full (Human) Translation of JP 2003-294022 A, Jul. 2003 (Year: 2003).*
Sep. 29, 2015 Search Report issued in International Patent Application No. PCT/JP2015/069317.

* cited by examiner (a)　　　　　　　　(b)

(a)　　　　　　　　(b)

HEAT-DISSIPATING COMPONENT AND METHOD FOR MANUFACTURING SAME

The present invention relates to a heat-dissipating component and a method for manufacturing the same.

BACKGROUND ART

In recent years, as heat-dissipating plates for power modules used in electric vehicles and electric railroad applications, aluminum silicon carbide composites are used in place of the conventional copper. While the thermal conductivity of aluminum silicon carbide composites is not as good as the thermal conductivity of copper, the thermal expansion coefficient thereof is 6-8 ppm/K, almost half of that of copper, which is 17 ppm/K, so the occurrence of cracking at the solder layer portion adhering the ceramic circuit board and the heat-dissipating plate that form the module is suppressed, and it is possible to obtain high reliability.

Aluminum silicon carbide composites are manufactured, for example, as described in Patent Document 1, by mixing additives into a silicon carbide powder, after which, a molded body is formed by a dry press method, an extrusion method, or an injection method, then, the molded body is baked to produce a porous molded body (preform) having silicon carbide as the main component, after which, this molded body is impregnated with an aluminum-containing metal with a method such as a non-pressurized impregnation method, a forging cast process, or a die casting process.

In addition, aluminum silicon carbide composites can be manufactured by mixing aluminum or an alloy powder thereof, into a silicon carbide powder and firing under pressure with a powder metallurgy method.

Aluminum silicon carbide composites are surface-treated or polished, after which, they are plated for use as components to dissipate heat generated from electronic-electric parts—that is, they are used as heat-dissipating components. In intermediate processing of such electronic/electric parts, modules are formed by screwing the components into parts for other heat dissipation purposes, such as heat-dissipating fins, or product outer frames. For this reason, in aluminum silicon carbide composites, through holes for screw fastening are formed in advance in the periphery or vicinity thereof of the aluminum silicon carbide composites.

As methods for forming the through holes, while a variety of methods are known, there are methods that, when manufacturing the molded body, involve using molded bodies wherein holes are formed in predetermined positions by using pins and the like at the time of molding or using molded bodies provided with hole portions by processing predetermined positions after manufacturing the molded body, and impregnating the molded body with an aluminum-containing metal, followed by forming hole portions by machining the metal locations.

Patent Document 1: JP 3468358 B
Patent Document 2: JP H5-507030 A
Patent Document 3: JP H9-157773 A

SUMMARY OF THE INVENTION

When trying to screw in aluminum silicon carbide composites having through holes formed by conventional methods in components such as heat-dissipating fins, there has been the problem of the periphery of the through holes cracking. Further, even if there are no problems at the time of attachment, when the heat cycles are applied at the time of implementation, there has been the problem of cracks appearing in the hole portions. In addition, there was a problem that defects occur in appearance due to occurrence of shrinkage cavities and hole cavities during impregnation with metal.

The present inventors, after seriously considering the cause and means to prevent the occurrence of cracks and breakage in through holes and the periphery thereof, discovered that the cause of the occurrence of cracks and breakage lies in the defect of micro-cracks existing in the through holes and periphery thereof and that, while aluminum silicon carbide composites have high strength, they have insufficient toughness, which leads to destruction. The present invention was made in view of such circumstances, and provides a heat-dissipating component and a manufacturing method thereof that suppress damage such as cracks and breakage in through holes and the periphery thereof occurring when affixing the heat-dissipating component to other components and when actually being used after being affixed and that suppresses shrinkage cavities and hole cavities during manufacture.

According to the present invention, a heat-dissipating component is provided that is characterized in comprising a composited portion including a plate-shaped molded body containing silicon carbide, and a hole-formation portion formed in a peripheral edge portion of the composited portion, in a through hole being formed in the hole-formation portion, and in the hole-formation portion containing inorganic fibers, in the molded body and the inorganic fibers being impregnated with an aluminum-containing metal, and in the hole-formation portion forming a portion of the outer peripheral surface of the heat-dissipating component.

According to one embodiment of the present invention, the heat-dissipating component is characterized in that the hole-formation portion comprises 3-30 vol % of inorganic fibers.

According to one embodiment of the present invention, the heat-dissipating component is characterized in that the aluminum-containing metal comprises 0.1-1.5 mass % of magnesium and 0.1-18 mass % of silicon.

According to one embodiment of the present invention, the heat-dissipating component is characterized in that a relative density of the molded body is 55-75%.

According to one embodiment of the present invention, the heat-dissipating component is characterized in that at least a portion of the heat-dissipating component is provided with a metal layer.

According to the present invention, a manufacturing method for a heat-dissipating component is provided, the method characterized in comprising a step of forming a plate-shaped molded body that has a notch portion and that comprises silicon carbide, a step of disposing inorganic fibers in the notch portion of the molded body, a step of forming a composited portion and a hole-formation portion by impregnating the molded body and the inorganic fibers with an aluminum-containing metal, and a step of cutting out the molded body in the shape of a plate-shaped heat-dissipating component, and in that the hole-formation portion forms a part of the outer peripheral surface of the heat-dissipating component.

According to one embodiment of the present invention, the manufacturing method of the heat-dissipating component is characterized in further comprising a step of providing the hole-formation portion with a through hole.

According to one embodiment of the present invention, the manufacturing method of the heat-dissipating component is characterized in that the hole-formation portion comprises 3-30 vol % of inorganic fibers.

According to one embodiment of the present invention, the manufacturing method of the heat-dissipating component is characterized in that the aluminum-containing metal comprises 0.1-1.5 mass % magnesium and 0.1-18 mass % of silicon.

According to one embodiment of the present invention, the manufacturing method of the heat-dissipating component is characterized in that a relative density of the molded body is 55-75%.

With the heat-dissipating component and the manufacturing method of the present invention, it is possible to suppress damage such as cracks and breakage in through holes and the periphery thereof occurring when affixing the heat-dissipating component to other components and when actually being used after being affixed and that can suppress shrinkage cavities and hole cavities during manufacture.

BRIEF DESCRIPTION OF THE DRAWINGS

FIG. 1(a) is a plan view and FIG. 1(b) is a sectional view taken along line A-A' of FIG. 1(a).

FIG. 2(a) is a plan view and FIG. 2(b) is a sectional view taken along line B-B' of FIG. 2(a).

MODES FOR CARRYING OUT THE INVENTION

Below, an embodiment of the present invention will be explained. Clearly, the present invention is not limited to these embodiments.

[Heat-Dissipating Component]

Figure 1:
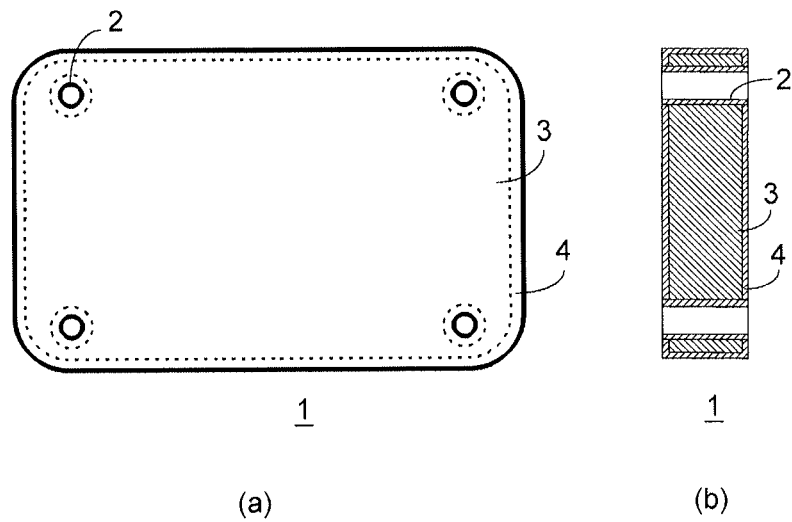
FIG. 1 illustrates the schematic structure of a conventional heat-dissipating component.

FIG. 1 illustrates the schematic structure of a conventional heat-dissipating component. FIG. 1(a) is a plan view and FIG. 1(b) is a sectional view taken along line A-A' of FIG. 1(a). The plate-shaped heat-dissipating component 1 has a rectangular shape in plan view when viewed from the plate surface direction and through holes 2 for fixing with screws to other components are provided at the four corners thereof. In addition, the heat-dissipating component consists of a composited portion 3 and an aluminum-containing metal portion 4. As illustrated in FIG. 1, in the conventional heat-dissipating component, the composited portion 3 is provided so as to surround the through holes 2.

Such a heat-dissipating component is formed by impregnating a molded body containing silicon carbide as a main component in which through holes 2 have been formed in advance with a an aluminum-containing metal with a conventionally-known method. In FIG. 1, while a metal portion 4 exists on the surface of the plate surface of the heat-dissipating component, the metal portion 4 is removed by machining, and the composited portion 3 can be exposed.

Figure 2:
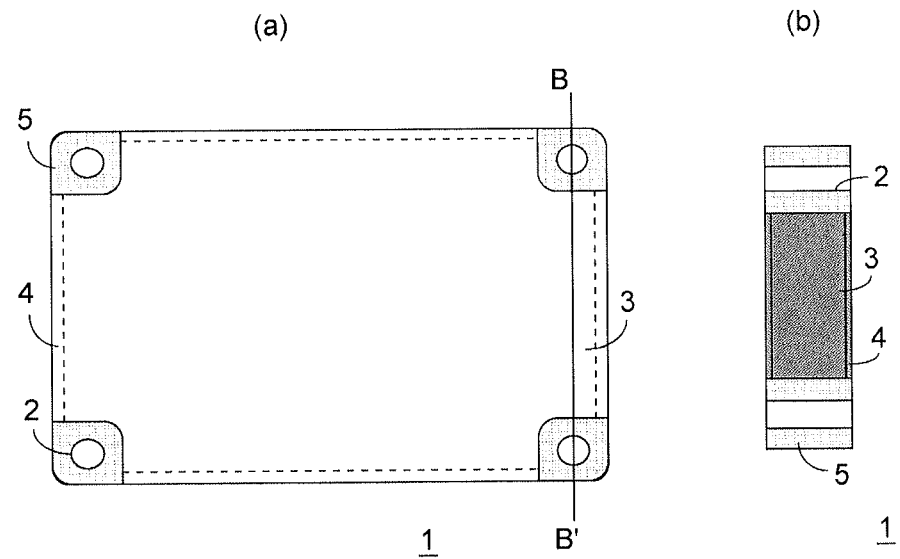
FIG. 2 is a drawing illustrating the schematic structure of a heat-dissipating component according to one embodiment of the present invention.

FIG. 2 is a drawing illustrating the schematic structure of a heat-dissipating component 1 according to an embodiment of the present invention. FIG. 2(a) is a plan view and FIG. 2(b) is a sectional view taken along line B-B' of FIG. 2(a). This heat-dissipating component 1 is characterized in comprising a composited portion 3 including a plate-shaped molded body having silicon carbide and hole-formation portions 5 formed in peripheral portions of the composited portion 3, in through holes 2 being formed in the hole-formation portions 5, and in the hole-formation portions 5 comprising inorganic fibers, in that the molded body and the inorganic fibers are impregnated with an aluminum-containing metal, and in that the hole-formation portions 5 form a part of the outer peripheral surface of the heat-dissipating component.

As illustrated in FIG. 2, through holes 2 are provided in the corners of the heat-dissipating component 1. By inserting screws into these through holes 2, it is possible to attach the heat-dissipating component 1 to other components with the screws. The through holes 2 are hole portions penetrating through the front and back plate surfaces of the plate-shaped heat-dissipating component 1, and the through holes 2 have their axes in the thickness direction.

As illustrated in FIG. 2, hole-formation portions 5 are provided in the periphery of the through holes 2. The plate-shaped heat-dissipating component 1 has a planar rectangular shape viewed from the plate surface direction, and it comprises an outer peripheral surface around the circumference of the front and back plate surfaces. Viewed from the outer peripheral direction of the heat-dissipating component 1, the hole-formation portions 5 are structures forming a portion of the outer peripheral surface. Viewed from the plate surface direction of the heat-dissipating component 1, the structure is such that the composited portion 3 is not present in a portion of the radial direction of the through holes 2. The hole-formation portions 5 have such structures, so the toughness of the hole-formation portions 5 improves, making it possible to prevent the occurrence of cracks and breakages that occurred commonly with the conventional structures.

The hole-formation portions 5 comprise a material composition differing from the composited portion 3 and the metal portion 4. Preferably, the hole-formation portions 5 are regions wherein an aluminum-containing metal is impregnated in the inorganic fibers, characterized by having high toughness compared with the composited portion 3 or the metal portion 4, and a tendency for cracks and breakages not to occur in that portion. By including inorganic fibers in the hole-formation portions 5, the occurrence of cracks and breakages can be prevented according to the structure and shape of the through holes 2 and the vicinity thereof. The aluminum-containing metal is preferably the same as the material constituting the metal portion 4 from the viewpoint of manufacturing.

The hole-formation portions 5 preferably comprise 3-30 vol % of inorganic fibers. By comprising 3-30 vol % of inorganic fibers it is possible to prevent the occurrence of shrinkage cavities and hole cavities. In particular, it is possible to set the maximum value of the size of the shrinkage cavities and hole cavities at most 1.0 mm$^2$. The included amount of the inorganic fibers, in order to toughen the hole portions, is preferably 5-30 vol %.

Examples of the inorganic fibers include metals, metal oxides, glass, and carbon, and of these, metal oxides are preferable, and alumina fibers are particularly preferable. By including the alumina fibers in the hole-formation portions 5, the effect of having a high affinity with the aluminum in particular is obtained. As alumina fibers, these are crystalline alumina fibers having an alumina content of 70% or more, particularly preferred for reasons of affinity with aluminum.

As illustrated in FIG. 2, the heat-dissipating component 1 comprises the composited portion 3 and the aluminum-containing metal portion 4. In the example of FIG. 2, the metal portion 4 exists on the plate surface of the heat-dissipating component 1, and the metal portion 4 may be removed by machining or the like to expose the composited portion 3.

The aluminum-containing metal preferably comprises 0.1-1.5 mass % of magnesium and 0.1-18 mass % of silicon, and through this, the effect of affinity with silicon carbide improves.

The molded body comprises silicon carbide, and as silicon carbides, those having an average particle size of 1 to 300 μm are preferable from the viewpoint of improving the density of the molded body. The relative density of the molded body is preferably 55-75%. By setting the relative density of the molded body at 55-75%, it is possible to set the thermal expansion coefficient of the heat-dissipating component at about 6-9 ppm/K. The relative density of the molded body is defined as the volume fraction of silicon carbide in the volume of the molded body. When manufacturing the molded body, it is possible to include binders in addition to the silicon carbide, wherein the ratio of the binders remaining in the molded body is at most 10% with respect to the relative density of the silicon carbide, As described above, the heat-dissipating component 1 according to the embodiments of the present invention is set such that the periphery of the through holes 2 is not surrounded by the composited portion 3, and in at least one direction from the through hole 2 to the outer periphery, the silicon carbide component derived from the molded body is excluded, and the structure is constituted by an aluminum-containing metal and inorganic fibers. For this reason, the toughness of the through holes 2 and the periphery thereof is improved, it is possible to suppress the occurrence of cracks and breakages, wherein, by the hole-formation portions 5 comprising inorganic fibers, it is possible to suppress the occurrence of shrinkage cavities and hole cavities originating from the shrinkage during production.

Figure 3:
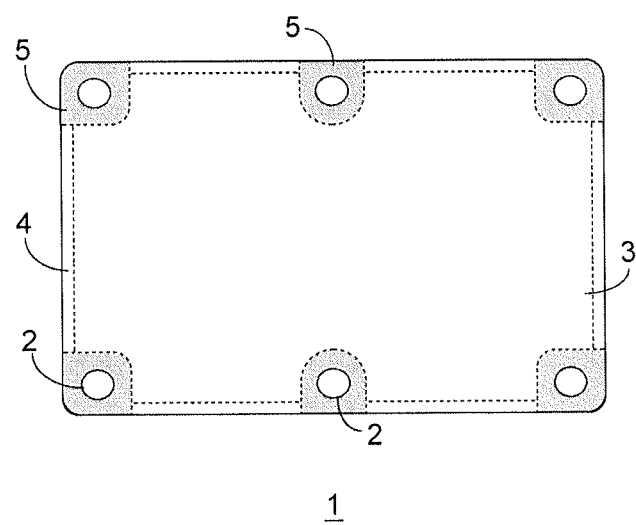
FIG. 3 is a schematic plan view of the heat-dissipating component according to one embodiment of the present invention.

Next, other embodiments of the present invention are explained. The heat-dissipating component 1 illustrated in FIG. 3 has a similar structure as the heat-dissipating component of the already-explained other embodiments based on FIG. 2, basically, wherein the through holes 2 are provided in the peripheral portions of the heat-dissipating component 1 in addition to the corner portions of the heat-dissipating component 1. In the example of FIG. 3, metal portions 4 are provided in the front surface and side surface side of the composited portion 3.

Here, the peripheral portion of the heat-dissipating component 1 means the area within a predetermined distance to the inside from the outer peripheral surface (side surface) of the heat-dissipating component 1.

Figure 4:
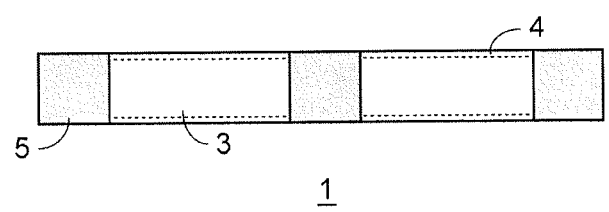
FIG. 4 is a schematic side view of the heat-dissipating component seen from the outer peripheral direction.

In the heat-dissipating component 1 illustrated in FIG. 3, viewed from the outer peripheral direction, as illustrated in FIG. 4, the hole-formation portions 5 form a portion of the outer peripheral surface.

In the above-described embodiments, the through holes are only provided in the peripheral portion of the heat-dissipating component, but in consideration of the structure of other components to which the heat-dissipating component is attached and the characteristics of the material constituting the heat-dissipating component, these can be disposed in any part of the heat-dissipating component. Also, in the above-noted embodiments, one hole-formation portion is provided in the periphery of one through hole, but it is also possible to have one hole-formation portion encompassing the periphery of a plurality of through holes.

With the heat-dissipating component according to the above-described embodiments, when screw affixing the heat dissipating components to other heat dissipating components such as a heat-dissipating fin or to other components such as product outer frames, and when actually using the component after the fixation, the suppression of damage such as cracks and breakages occurring at the through holes and periphery thereof occurring at the time of fixation and after fixation can be suppressed, and it is possible to suppress the occurrence of shrinkage cavities and hole cavities during manufacture Manufacturing Method of the Heat Dissipating Component Next, an example will be provided to explain the manufacturing method for the heat dissipating component according to the present invention. The manufacturing method of the heat-dissipating component according to the present embodiment is characterized in comprising the step of forming a plate-shaped molded body comprising a notch portion and including silicon carbide, the step of disposing inorganic fibers in the notch portion of the molded body, the step of forming a composited portion and a hole-formation portion by impregnating an aluminum-containing metal in the molded body and the inorganic fibers, and the step of cutting out the molded body in the shape of the plate-shaped heat-dissipating component, and in that the hole-formation portion forms a portion of the outer peripheral surface of the heat-dissipating component.

In the below-described examples, a manufacturing method wherein a silicon carbide molded body is manufactured with a wet-press method and wherein this molded body is impregnated with an aluminum-containing metal by a forging cast process will be explained.

First, in the step of forming the molded body comprising notch portions and including silicon carbide, as a method of molding silicon carbide powder, it is possible to use the conventionally-known dry-press method, wet-press method, extrusion-molding method, injection method, casting method, and method of punching out after sheet-molding. In addition, an inorganic or organic binder can be appropriately added according to the above-mentioned molding method in order to develop enough strength so that abnormalities such as cracking do not occur when impregnating with metal. Since it is possible to obtain a strong molded body, as the binder, a silica sol is preferable. In terms of the volume ratio, the binder is preferably added in an amount of 20 parts or less with respect to 100 parts of silicon carbide as solid content for the purpose of improving the relative density.

For example, in cases where a wet-press method is employed, porous concave and convex molds are prepared, a silicon carbide powder and a slurry comprising the inorganic binder and water as main constituents are filled into the concave mold, and compression molding is performed with the convex mold. In cases where the wet-press method is applied, as illustrated in FIGS. 2 and 3, in the periphery of through holes 2, hole-formation portions 5 can be formed by shaping so that notch portions are formed in the molded body. The notch portions are preferably formed by using a mold or the like having the desired shape of the notch portions during compression molding. Further, the notch portions can be formed by machining the plate-shaped molded body.

Though differing depending on the manufacturing method, the molded bodies manufactured by each of the above-described manufacturing methods are usually subjected to drying and heating/degreasing treatments and then fired to obtain a molded body having a predetermined strength. As the firing conditions, it is preferably performed in an inert atmosphere or in air at a temperature of 700 degrees Celsius or higher, though in the case of air, when firing at a temperature of at least 1100 degrees Celsius, the silicon carbide is oxidized and the thermal conductivity of the composite decreases, so at least it is preferable to fire the molded bodies at this temperature or lower.

The relative density of the molded body is preferably set at 55-75%. By setting the relative density of the molded body at 55-75%, the thermal expansion coefficient of the heat-dissipating component can be set at about 6-9 ppm/K. In order to set the relative density of the molded body at 55-75%, it is preferable to blend silicon carbide powders having different particle sizes. In the case of silicon carbide, using a mixture of a powder having an average particle size of 100 μm and a powder having an average particle size of 10 μm or finer, or a powder having an average particle size of 60 μm and a powder having an average particle size of 10 μm or finer is one example. The average particle size can be measured by using a scanning electron microscope (for example, "JSM-T 200" manufactured by JEOL Ltd.) and an image analyzing apparatus (for example, manufactured by Nippon Avionics Co., Ltd.) to calculate the average value of the diameters found for 1000 particles.

In the step of disposing inorganic fibers in the notch portions of the molded body, in order to suppress the shrinkage cavities and hole cavities that occur when impregnating the metal, the inorganic fibers are arranged around the portions where the through holes are provided, that is, the notch portions of the molded body. As the inorganic fibers, it is preferable to use an inorganic fiber having low reactivity with an aluminum-containing metal, for example, an alumina fiber.

The inorganic fibers are preferably disposed such that the filling ratio of the inorganic fibers in the hole-formation portions is 3-30 vol %. If the filling ratio is at least 3 vol %, then the suppression effects of the occurrence of shrinkage cavities and hole cavities is high, and it is possible to keep the maximum value of the size of shrinkage cavities and hole cavities to at most 1.0 mm$^2$. When the filling ratio is at most 30 vol %, then subsequent processing of the through holes becomes easy.

In the step of forming the composited portion and the hole-formation portions by impregnating the molded body and the inorganic fibers with an aluminum-containing metal, so-called forging cast processes and die casting processes can be employed in order to impregnate the molded body with the aluminum-containing metal.

When employing a forging cast process, the molded body is filled into a mold with a spout having the shape of the product, then further, this is set in a press-concave mold, a molten aluminum-containing metal is poured into said concave mold, this is sealed in a convex mold, and after pressing, the molten metal is cooled and hardened, and set in a block shape. After cooling, an aluminum-silicon carbide composite having the product shape is obtained from the block, and by devising the shape of the mold having a spout, it is possible to obtain many aluminum-silicon carbide composites. The die casting processes are methods of setting the molded body in a mold having a cavity in the shape of the product, performing mold clamping, after which, an aluminum-containing metal is injected at a high speed, and a composite body is then obtained.

When impregnating the molded body and the inorganic fibers with the molten aluminum-containing metal, in both of the processes, it is preferable for the molded body and the inorganic fibers to be heated before the impregnation. This is to prevent the molten aluminum-containing metal in the molded body from solidifying while still not fully impregnated during the impregnation step. The suitable heating temperature varies depending on the composition of the aluminum alloy to be used and the size and shape of the molded article, but it is preferable to preheat it to 550 degrees Celsius or higher. In addition, the melt temperature of the molten aluminum or alloy thereof to be impregnated is preferably at least 750 degrees Celsius. In the case where the metal-containing aluminum contains 0.1 to 1.5 mass % of magnesium and 0.1 to 18 mass % of silicon, temperature conditions of at most 900 degrees Celsius are particularly preferable.

In the step of cutting out the molded body in the shape of the plate-shaped heat-dissipating component, a portion of the composited portion and the hole-formation portions is formed by cutting into a predetermined shape. In this step, for example, after cooling to room temperature, it is preferable to form the heat-dissipating component having a desired shape by cutting with a wet band saw or the like.

In the heat-dissipating component manufactured by the above-described manufacturing methods, at least a portion of the hole-formation portions is exposed at an outer peripheral surface thereof. Further, by providing the hole-formation portions with through holes, it is possible to manufacture a heat-dissipating component having a structure wherein the hole-formation portions, provided around the through holes of the plate-shaped heat dissipating-component having a composited portion impregnated with an aluminum-containing metal in the molded body containing silicon carbide, form a portion of the outer peripheral surface of the heat-dissipating component.

EXAMPLES

The present invention will be further explained with the following examples and comparative examples, though the present invention is not limited to these.

Examples 1-6

Silicon carbide powder A (NG-150, average particle size 100 μM: manufactured by Pacific Rundum Co., Ltd.), silicon carbide powder B (GC-1000 F, average particle size 10 μm: manufactured by Yakushima Denko Co., Ltd.), and a silica sol (Snowtex: manufactured by Nissan Chemical Industries Co., Ltd.,) were blended in a composition at a mass ratio of 60:40:10 and mixed for one hour with a stirring mixer.

This mixed powder was molded, at a pressure of 10 MPa, into a shape of 120 mm×70 mm×7 mm having notches at the four corners. The four corners of the edges of this molded body had notches of 15 mm×15 mm. This molded body was dried for two hours at 120 degrees Celsius, and was heated for two hours at 960 degrees Celsius in air, leading to the manufacturing of a silicon carbide porous body.

Further, the obtained silicon carbide porous body was processed to a shape of 20 mmφ×7 mm, and the relative density as calculated from its dimensions and mass was 65%.

Next, the obtained silicon carbide porous body was processed to a thickness of 4.8 mm with a diamond processing tool, and each of twelve specimens was sandwiched between 0.8 mm thick SUS plates coated with a release agent, and a 12 mm thick iron plate was fixed with 10 mmφ bolts and nuts to form one block.

Here, the notch portions of the corners were filled with aluminum short fibers (mullite ceramic fibers) to between 3 and 30 vol %. The aluminum short fibers were Alcen, manufactured by Denki Kagaku Kogyo K. K.

Next, four of the above-described blocks, as one block, were preheated at 650 degrees Celsius in an electric furnace and placed in a preheated press mold having a cavity with inner dimensions of 320 mm×260 mm×440 mm. A molten aluminum alloy (comprising 12 mass % of silicon and 0.9 mass % of magnesium), heated at 810 degrees Celsius, was poured into a press mold, was pressed for at least 13 minutes at a pressure of 500 MPa, and an aluminum-containing metal was impregnated into the silicon carbide molded body and the aluminum short fibers.

The metal block comprising the composite body obtained in the above-described step was cooled to room temperature, after which, cutting with a wet band saw was performed to take out a 120 mm×70 mm×5 mm tubular aluminum-silicon carbide composite body comprising a composited portion comprising an aluminum alloy and silicon carbide and hole-formation portions comprising an aluminum alloy and aluminum short fibers.

Impregnation for five blocks was performed as per the above-described method. Further, through holes having a diameter of 7.5 mm centered at positions of 7.5 mm from the periphery of the corner portions of the aluminum-silicon carbide composite were formed by machining. That is, the through holes were formed in the portions where the hole-formation portions were formed. Through the above-described steps, a heat-dissipating component having the shape of that illustrated in FIG. 2 was manufactured.

Concerning these heat-dissipating components, each was tightened and fixed to an aluminum plate having a size of 120 mm×70 mm×10 mm with holes of 7.5 mm in diameter at the four corners by using bolts and nuts. At this time, the tightening torque was set to 4, 8, 10, 12, and 15 Nm with a torque wrench.

Next, each of the heat-dissipating components was subjected to 300 cycles of thermal cycling in which one cycle was −40 degrees Celsius for 30 minutes and 125 degrees Celsius for 30 minutes, then the attachment between the heat-dissipating component and the aluminum plate was released, and the four corners of the composite body were measured with an ultrasonic flaw detector (FS-Line manufactured by Hitachi Construction Machinery Co., Ltd.) in order to search for the presence or absence of flaws. The results thereof are displayed in Table 1.

Each of the composite bodies manufactured with the above-described procedure was subjected to blast treatment with alumina abrasive grains under conditions of a pressure of 0.4 MPa and a conveying speed of 1.0 m/min and cleaned, after which, electroless Ni—P and Ni—B plating was performed, and plating layers having a thickness of 8 μm (Ni—P: 6 μm+Ni-B: 2 μm) were formed on the surfaces of the composite bodies, With respect to the composite bodies having the plating layers that were formed as described above, the maximum values of the shrinkage cavities and the hole cavities were investigated with a magnifying glass (a loupe with a magnifying power of 10 times), and the occurrence rate of shrinkage cavities and hole cavities was also investigated. The measured area was the entirety of the front surface, back surface, and side surface of the composite bodies, and the occurrence rate of shrinkage cavities and hole cavities in 100 sheets (the proportion of places where shrinkage cavities and hole cavities were observed with respect to the number of holes in 100 sheets) was investigated. In addition, the size of the shrinkage cavities and hole cavities was determined on the basis of JIS P 8145 "Paper and Paperboard—Foreign Matter Evaluation Method" and JIS P 8208 "Pulp—Miscellaneous Matter Measurement Method." The results are shown in Table 1.

Comparative Examples 1-3

Manufacturing of the silicon carbide porous body was performed in a similar manner as example 1. However, through holes having a diameter of 9 mm were formed in the four corners of the molded body by machining after firing. In addition, after filling the formed through holes with aluminum short fibers similar to those employed in example 1, metal impregnation and machining similar to example 1 were performed, and heat-dissipating components were manufactured. Then, through holes having a diameter of 7.5 mm were formed in the portion formed by the aluminum short fibers and the impregnated metal. That is, in these comparative examples, the portion formed by the aluminum short fibers and the impregnated metal has a structure not forming a portion of the outer peripheral surface of the heat-dissipating component. For these heat-dissipating components, the same evaluation as that of example 1 was carried out. The results are shown in Table 1.

Comparative Example 4

Aside from the fact that the notch portions of the four corners were not filled with the aluminum short fibers, the heat-dissipating components were manufactured in the same way as example 1. For these heat-dissipating components, the same evaluation as that of example 1 was carried out. The results are shown in Table 1.

Examples 7-12

These examples were the same as example 1 with respect to the basic manufacturing method, except that the aluminum alloys comprised 0.1, 1, 5, 8, 16, and 18 mass % of silicon and 1.5, 1.2, and 0.1 mass % of magnesium, respectively, and the relative densities of the silicon carbide porous bodies were respectively 55, 65, and 75%. As the molded body, a molded body such as that illustrated in FIG. 3 was mold compressed to have U-shaped notch portions at the four corners and the long-side portions of the rectangular-shaped body, and in these portions, through holes having a diameter of 7.5 mm were formed. The size of the molded body was 130 mm×80 mm×5 mm, and the center position of the through holes was a position 7 mm inward from the outer peripheral surface. The U-shaped notch portions had a depth of 12 mm and a width of 10 mm. The distance between the centers of adjacent through holes on the same long side was 45 mm. For these heat-dissipating components, the same evaluation as that of example 1 was carried out. The results are shown in Table 2.

Comparative Examples 5-7

With steps similar to example 1, a rectangular-type molded body (120 mm×70 mm×5 mm) not having notch portions was manufactured, and through holes having diameters of 9 mm were provided along the long sides of the molded body through machining. In addition, after filling the further formed through holes with aluminum short fibers similar to those employed in example 1, metal impregnation and machining similar to example 1 were performed, and heat-dissipating components were manufactured. The compositions of the aluminum alloys are as illustrated in Table 2. Further, through holes having a diameter of 7.5 mm were formed in the portion consisting of the aluminum short fibers and the impregnated metal. The through holes were provided in the same positions as those of example 1. That is, in these comparative examples, the portion consisting of the aluminum short fibers and the impregnated metal has a structure not forming a portion of the outer peripheral surface of the heat-dissipating component. For these heat-dissipating components, the same evaluation as that of example 1 was carried out. The results are shown in Table 2.

Comparative Examples 8-10

The shape of the molded body is the same as example 7 as shown in FIG. 3, but the notch portions of the post-fired molded body were not filled with aluminum short fibers. As shown in Table 2, the component composition of the molten aluminum was changed. These comparative examples were the same as example 1 with respect to the basic manufacturing method. For these heat-dissipating components, the same evaluation as that of example 1 was carried out. The results are shown in Table 2.

TABLE 1

|  | Included amount of inorganic fibers (Volume %) | Sample No. | Tightening Torque (Nm) | Ultrasonic Flaw Detection Measurement Results | Shrinkage Cavities and Hole Cavities | |
|---|---|---|---|---|---|---|
|  |  |  |  |  | Occurence Rate (%) | Maximum Diamter (mm$^2$) |
| Example1 | 3 | 1 | 4 | no cracks and breakage | 0.5 | 0.3 |
|  |  | 2 | 8 | no cracks and breakage |  |  |
|  |  | 3 | 10 | no cracks and breakage |  |  |
|  |  | 4 | 12 | no cracks and breakage |  |  |
|  |  | 5 | 15 | no cracks and breakage |  |  |
| Example2 | 7 | 1 | 4 | no cracks and breakage | 2.0 | 0.7 |
|  |  | 2 | 8 | no cracks and breakage |  |  |
|  |  | 3 | 10 | no cracks and breakage |  |  |
|  |  | 4 | 12 | no cracks and breakage |  |  |
|  |  | 5 | 15 | no cracks and breakage |  |  |
| Example3 | 10 | 1 | 4 | no cracks and breakage | 1.0 | 0.5 |
|  |  | 2 | 8 | no cracks and breakage |  |  |
|  |  | 3 | 10 | no cracks and breakage |  |  |
|  |  | 4 | 12 | no cracks and breakage |  |  |
|  |  | 5 | 15 | no cracks and breakage |  |  |
| Example4 | 15 | 1 | 4 | no cracks and breakage | 0.4 | 0.2 |
|  |  | 2 | 8 | no cracks and breakage |  |  |
|  |  | 3 | 10 | no cracks and breakage |  |  |
|  |  | 4 | 12 | no cracks and breakage |  |  |
|  |  | 5 | 15 | no cracks and breakage |  |  |
| Example5 | 20 | 1 | 4 | no cracks and breakage | 1.4 | 0.8 |
|  |  | 2 | 8 | no cracks and breakage |  |  |
|  |  | 3 | 10 | no cracks and breakage |  |  |
|  |  | 4 | 12 | no cracks and breakage |  |  |
|  |  | 5 | 15 | no cracks and breakage |  |  |
| Example6 | 30 | 1 | 4 | no cracks and breakage | 1.2 | 0.6 |
|  |  | 2 | 8 | no cracks and breakage |  |  |
|  |  | 3 | 10 | no cracks and breakage |  |  |
|  |  | 4 | 12 | no cracks and breakage |  |  |
|  |  | 5 | 15 | no cracks and breakage |  |  |
| Comparative example1 | 7 | 1 | 4 | no cracks and breakage | 1.8 | 0.8 |
|  |  | 2 | 8 | no cracks and breakage |  |  |
|  |  | 3 | 10 | no cracks and breakage |  |  |
|  |  | 4 | 12 | cracks from the hole to the outer periphery |  |  |
|  |  | 5 | 15 | no cracks and breakage |  |  |
| Comparative example2 | 10 | 1 | 4 | no cracks and breakage | 1.2 | 0.6 |
|  |  | 2 | 8 | no cracks and breakage |  |  |
|  |  | 3 | 10 | no cracks and breakage |  |  |
|  |  | 4 | 12 | cracks from the hole to the outer periphery |  |  |
|  |  | 5 | 15 | no cracks and breakage |  |  |
| Comparative example3 | 15 | 1 | 4 | no cracks and breakage | 0.6 | 0.3 |
|  |  | 2 | 8 | cracks from the hole to the outer periphery |  |  |
|  |  | 3 | 10 | no cracks and breakage |  |  |
|  |  | 4 | 12 | no cracks and breakage |  |  |
|  |  | 5 | 15 | no cracks and breakage |  |  |
| Comparative example4 | 0 | 1 | 4 | no cracks and breakage | 5.0 | 5.5 |
|  |  | 2 | 8 | no cracks and breakage |  |  |
|  |  | 3 | 10 | no cracks and breakage |  |  |
|  |  | 4 | 12 | no cracks and breakage |  |  |
|  |  | 5 | 15 | no cracks and breakage |  |  |

TABLE 2

| | Included amount of inorganic fibers (Volume %) | Molten Aluminum Alloy Component | | Silicon Carbide Molded Body Relative Density (%) | Sample No. | Evaluation | | Shrinkage Cavities and Hole Cavities | |
|---|---|---|---|---|---|---|---|---|---|
| | | Si amount (Mass %) | Mg amount (Mass %) | | | Tightening Torque (Nm) | Ultrasonic Flaw Detection Measurement Results | Occurence Rate (%) | Maximum Diamter (mm²) |
| Example7 | 7 | 0.1 | 1.5 | 55 | 1 | 4 | no cracks and breakage | 0.5 | 0.8 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | no cracks and breakage | | |
| Example8 | 7 | 1 | 1.5 | 55 | 1 | 4 | no cracks and breakage | 0.3 | 0.7 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | no cracks and breakage | | |
| Example9 | 7 | 5 | 1.2 | 65 | 1 | 4 | no cracks and breakage | 1.0 | 0.5 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | no cracks and breakage | | |
| Example10 | 7 | 8 | 1.2 | 65 | 1 | 4 | no cracks and breakage | 0.6 | 0.5 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | no cracks and breakage | | |
| Example11 | 7 | 16 | 1.5 | 65 | 1 | 4 | no cracks and breakage | 0.6 | 0.3 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | no cracks and breakage | | |
| Example12 | 7 | 18 | 0.1 | 75 | 1 | 4 | no cracks and breakage | 0.8 | 0.2 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | no cracks and breakage | | |
| Comparative example5 | 7 | 0.1 | 1.5 | 55 | 1 | 4 | no cracks and breakage | 1.0 | 0.8 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | cracks from the hole to the outer periphery | | |
| Comparative example6 | 7 | 5 | 1.2 | 65 | 1 | 4 | no cracks and breakage | 0.4 | 0.3 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | cracks from the hole to the outer periphery | | |
| Comparative example7 | 7 | 18 | 0.1 | 75 | 1 | 4 | no cracks and breakage | 0.4 | 0.2 |
| | | | | | 2 | 8 | no cracks and breakage | | |
| | | | | | 3 | 10 | cracks from the hole to the outer periphery | | |
| | | | | | 4 | 12 | no cracks and breakage | | |
| | | | | | 5 | 15 | no cracks and breakage | | |
| Comparative example8 | 0 | 0.1 | 1.5 | 55 | 1 | 4 | no cracks and breakage | 8.0 | 7.0 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | no cracks and breakage | | |
| Comparative example9 | 0 | 5 | 1.2 | 65 | 1 | 4 | no cracks and breakage | 6.0 | 5.4 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | no cracks and breakage | | |
| Comparative example10 | 0 | 18 | 0.1 | 75 | 1 | 4 | no cracks and breakage | 5.0 | 4.5 |
| | | | | | 2 | 8 | no cracks and breakage | | |
| | | | | | 3 | 10 | no cracks and breakage | | |
| | | | | | 4 | 12 | no cracks and breakage | | |
| | | | | | 5 | 15 | no cracks and breakage | | |

As can be seen from the results shown in Tables 1 and 2, the heat-dissipating component according to the present invention can suppress damage such as cracks and breakage in through holes and the periphery thereof occurring when affixing the heat-dissipating component to other components and when actually being used after being affixed and can suppress the occurrence of shrinkage cavities and hole cavities during manufacture.

The heat-dissipating component according to the present invention has improved toughness at the periphery of through holes for fastening to other components, suppresses the occurrence of damage such as cracks and breakage when fastening the component to other heat dissipating components such as heat-dissipating fins or to other components such as product outer frames, and when actually using the component after said fastening, and exhibits high reliability when used in power modules and the like.

EXPLANATION OF THE REFERENCE NUMBERS

1 Heat-dissipating component
2 Through holes
3 Composited portion
4 Metal portion
5 Hole-formation portions

The invention claimed is:

1. A manufacturing method of a heat-dissipating component, comprising
    forming a plate-shaped molded body having notch portions and comprising silicon carbide,
    disposing inorganic fibers at the notch portions of the molded body,
    forming a composited portion and hole-formation portions by impregnating the molded body and the inorganic fibers with an aluminum-containing metal, and
    cutting out the molded body in the shape of a plate-shaped heat-dissipating component, wherein the cutting out the molded body comprises cutting a portion of the composited portion and the hole-formation portions,
    wherein each of the hole-formation portions forms a part of an outer peripheral surface of the heat-dissipating component, the entirety of the hole-formation portions contains inorganic fibers at a volume of 3-30%, such that at least one portion of the outer peripheral surface of the heat-dissipating component comprises the inorganic fibers, and the inorganic fibers comprise crystalline alumina fibers having an alumina content of 70% or more.

2. The manufacturing method of a heat-dissipating component according to claim 1, further comprising providing through holes in the hole-formation portions.

3. The manufacturing method of a heat-dissipating component according to claim 1, wherein the relative density of the molded body is 55-75%.

4. The manufacturing method of a heat-dissipating component according to claim 1, wherein the aluminum-containing metal comprises from 0.9 to 1.5 mass % of magnesium and from 1 to 18 mass % of silicon.

* * * * *